United States Patent
Shen et al.

(10) Patent No.: US 12,295,214 B2
(45) Date of Patent: May 6, 2025

(54) DISPLAY PANEL INCLUDING LIGHT MODULATION STRUCTURE AND DISPLAY DEVICE INCLUDING THE DISPLAY PANEL

(71) Applicant: Hubei Yangtze Industrial Innovation Center Of Advanced Display Co., Ltd., Wuhan (CN)

(72) Inventors: Peng Shen, Wuhan (CN); Junqiang Wang, Wuhan (CN); Jiaxian Liu, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 564 days.

(21) Appl. No.: 17/719,409

(22) Filed: Apr. 13, 2022

(65) Prior Publication Data

US 2023/0217716 A1 Jul. 6, 2023

(30) Foreign Application Priority Data

Dec. 31, 2021 (CN) .......................... 202111676224.0

(51) Int. Cl.
*H10K 59/122* (2023.01)
*H10K 50/858* (2023.01)
*H10K 50/86* (2023.01)
*H10K 59/38* (2023.01)

(52) U.S. Cl.
CPC ......... *H10K 59/122* (2023.02); *H10K 50/858* (2023.02); *H10K 50/865* (2023.02); *H10K 59/38* (2023.02)

(58) Field of Classification Search
CPC .. H10K 59/122; H10K 50/858; H10K 50/865; H10K 59/38; H10K 59/12; H10K 59/8792; H10K 59/879
See application file for complete search history.

(56) References Cited

U.S. PATENT DOCUMENTS

| | | | |
|---|---|---|---|
| 2020/0185652 A1 | 6/2020 | Sun | |
| 2022/0045304 A1* | 2/2022 | Cai | ...................... H10K 59/353 |
| 2022/0085337 A1* | 3/2022 | Cai | ...................... H10K 50/858 |

FOREIGN PATENT DOCUMENTS

| | | |
|---|---|---|
| CN | 111599850 A | 8/2020 |
| CN | 112186007 A | 1/2021 |
| CN | 113328055 A | 8/2021 |

(Continued)

OTHER PUBLICATIONS

The First Office Action for Chinese Application No. 202111676224. 0, dated Aug. 31, 2023, 9 pages.

*Primary Examiner* — Thanh Y. Tran
(74) *Attorney, Agent, or Firm* — East IP P.C.

(57) ABSTRACT

The present application provides a display panel and a display device, the display panel includes a light extraction layer and a cover layer, wherein the light extraction layer is located on a side of the cover layer close to a pixel definition layer, a light modulation structure includes a plurality of light extraction units, each of the light extraction units includes a first sub-unit and a second sub-unit, wherein the light extraction layer includes a light extraction opening and the first sub-unit, the second sub-unit is located in the cover layer, and a refractive index of the first sub-unit is smaller than a refractive index of the second sub-unit.

20 Claims, 8 Drawing Sheets

(56) References Cited

FOREIGN PATENT DOCUMENTS

| | | | |
|---|---|---|---|
| CN | 113471385 | A | 10/2021 |
| CN | 113471386 | A | 10/2021 |
| CN | 113471388 | A | 10/2021 |
| CN | 113838997 | A | 12/2021 |
| WO | 2014188631 | A1 | 11/2014 |

* cited by examiner

DISPLAY PANEL INCLUDING LIGHT MODULATION STRUCTURE AND DISPLAY DEVICE INCLUDING THE DISPLAY PANEL

CROSS-REFERENCE TO RELATED APPLICATION

This application is based on and claims priority to Chinese Patent Application No. 202111676224.0, filed on Dec. 31, 2021 and titled "DISPLAY PANEL AND DISPLAY DEVICE", the contents of which are incorporated herein by reference in their entireties.

TECHNICAL FIELD

The present application relates to the technical field of display, and in particular, to a display panel and a display device.

BACKGROUND

Compared with liquid crystal displays, organic light-emitting displays have many advantages such as thinner, higher brightness, lower power consumption, faster response, higher definition, better flexibility, and higher light-emitting efficiency, and have gradually become the mainstream display technology. The light-emitting principle of organic light-emitting displays is that holes generated by an anode and electrons generated by a cathode in an organic light-emitting device move under the action of an electric field, inject into a hole transport layer and an electron transport layer respectively, and migrate to an organic light-emitting material layer, and when they meet in the light-emitting material layer, energy excitons are generated, thereby exciting light-emitting molecules in the organic light-emitting material layer to generate visible light. An organic light-emitting display includes multiple layers of film structures with different refractive indices, which will cause the light emitted by a pixel to be reflected and refracted in various ways and cannot be emitted directly above the pixel, thereby affecting the light-emitting brightness; meanwhile, light with a large angle may reach adjacent pixels, thereby causing color mixing problems.

SUMMARY

In view of this, the present application provides a display panel and a display device.

In a first aspect, the present application provide a display panel, including: a substrate; a pixel definition layer and light-emitting units, wherein the pixel definition layer is located on one side of the substrate, the pixel definition layer includes a plurality of pixel openings, and the pixel openings are arranged corresponding to the light-emitting units; a light modulation structure including a light extraction layer and a cover layer, wherein the light extraction layer is located on a side of the cover layer close to the pixel definition layer, the light modulation structure includes a plurality of light extraction units, each of the light extraction units includes a first sub-unit and a second sub-unit, wherein the light extraction layer includes a light extraction opening and the first sub-unit, first sub-units enclose the light extraction opening, the light extraction opening overlaps with the pixel openings, the second sub-unit is located in the cover layer, and a refractive index of the first sub-unit is smaller than a refractive index of the second sub-unit.

In a second aspect, the present application further provides a display device, including the display panel provided by the present application.

Other features and advantages of the present application will become apparent from the following detailed description of exemplary embodiments of the present application with reference to the accompanying drawings.

DETAILED DESCRIPTION

Figure 1:
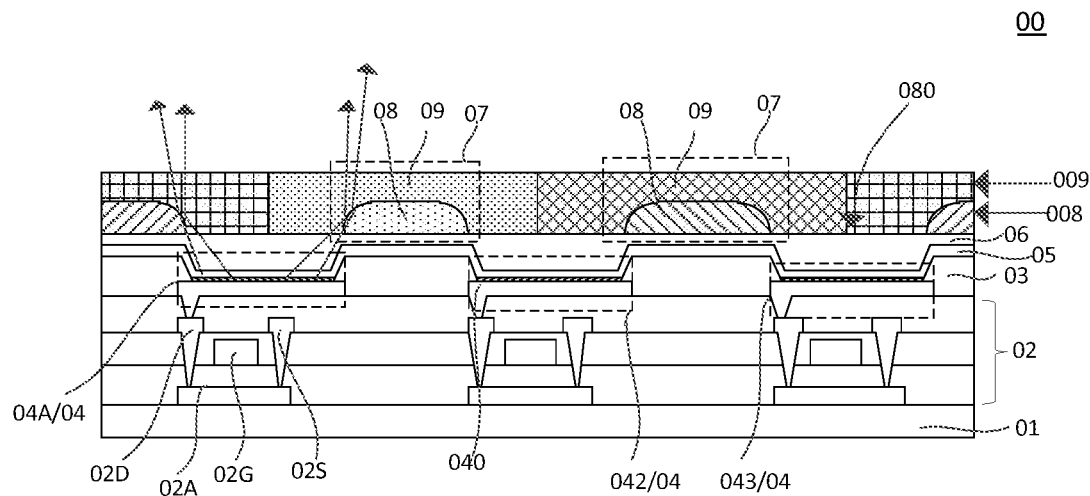
FIG. 1 is a schematic diagram of an optional implementation of a display panel provided by an embodiment of the present application.

In order to make the above purposes, features and advantages of the present application more clearly understood, the present application will be further described below with reference to the accompanying drawings and embodiments.

It should be noted that specific details are set forth in the following description in order to facilitate a thorough understanding of the present application. However, the present application can be implemented in many other ways different from those described herein, and those skilled in the art can make similar promotions without departing from the connotation of the present application. Accordingly, the present application is not limited by the specific embodiments disclosed below. In addition, in the following description, the same reference numerals in the drawings denote the same or similar structures, and thus their repeated descriptions will be omitted.

FIG. 1 is a schematic diagram of an optional implementation of a display panel provided by an embodiment of the present application. Referring to FIG. 1, the display panel 00 includes a substrate 01, a pixel definition layer 03 and light-emitting units 04, the pixel definition layer 03 is located on one side of the substrate 01, the pixel definition layer 03 includes a plurality of pixel openings (not shown in the figure), and the pixel openings are arranged corresponding to the light-emitting units 04. Optionally, the display panel further includes an array layer 02, the array layer 02 is located between the pixel definition layer 03 and the substrate 01, the array layer 02 includes a plurality of thin film transistors, and the thin film transistors include source and drain electrodes 02S/02D, gate electrodes 02G and active layers 02A. The present application only illustrates a technical solution in which the number of thin film transistors is one. It can be understood that the number of thin film transistors can be any number, and the specific number can be set according to specific requirements of the display panel, which is not specifically limited in this embodiment.

As shown in FIG. 1, the light-emitting layer 04 includes an anode 040, a light-emitting material layer 04A and a cathode 05, wherein a material of the anode 040 includes ITO/Ag/ITO, and a material of the cathode 05 includes a magnesium-silver alloy. In the embodiment of the present application, organic light-emitting diodes (OLEDs) may be selected to fabricate the above-mentioned light-emitting units 04. Alternatively, the light-emitting units 04 may also be configured as micro light-emitting diode (Micro-LEDs) or quantum dot light-emitting diodes (QLEDs).

The display panel 00 further includes a light modulation structure, the light modulation structure includes a light extraction layer 008 and a cover layer 009, the light modulation structure includes a plurality of light extraction units 07, each of the light extraction units 07 includes a first sub-unit 08 and a second sub-unit 09, wherein the light extraction layer includes a light extraction opening 080 and the first sub-unit 08, first sub-units 08 enclose the light extraction opening 080, the light extraction opening 080 overlaps with the pixel openings 04, the second sub-unit 08 is located in the cover layer 009, and the cover layer 009 fills the light extraction opening 080. A refractive index of the first sub-unit 08 is smaller than a refractive index of the second sub-unit. Compared with the prior art, the light extraction units 07 can change a light path of the light that is originally emitted from the light-emitting units and cannot be normally emitted from the display panel 00; each of the light extraction units 07 includes the first sub-unit 08 and the second sub-unit 09, the refractive index of the first sub-unit 08 is smaller than the refractive index of the second sub-unit 09, and using functions of total reflection and refraction of the light by the light extraction units 07, the large-angle light that cannot be normally emitted by the sub-units can be successfully emitted from the display panel, which improves the light extraction efficiency of a front viewing angle of the display panel and the display effect of the display panel.

Optionally, the display panel 00 further includes a thin film encapsulation layer 06, and the thin film encapsulation layer 06 is located between the light modulation structure and the light-emitting units 04. Optionally, the thin film encapsulation layer 04 may include one, two or more than three film layers, and the thin film encapsulation layer 04 may include alternately arranged organic layers and inorganic layers. In the display panel provided in this embodiment, the substrate 01 is a flexible substrate, which has the property of being bendable. Optionally, the thin film encapsulation layer 06 has good bendability. The display panel provided in this embodiment can be bent or kinked. This embodiment does not specifically limit the specific material and film layer structure of the thin film encapsulation layer 06.

Optionally, a difference between the refractive index of the first sub-unit 08 and the refractive index of the second sub-unit 09 is $\Delta n$, wherein $0.17 \leq \Delta n \leq 0.25$. Due to the difference in refractive index between the first sub-unit 08 and the second sub-unit 09, the light emitted by the light-emitting units will undergo total reflection or refraction when passing through an interface of the first sub-unit 08 and the second sub-unit 09, and through the difference in refractive index between the first sub-unit 08 and the second sub-unit 09, a proportion of total reflection phenomenon and refraction phenomenon of light can be adjusted when the light of the light-emitting units passes through the interface of the first sub-unit 08 and the second sub-unit 09. The applicants have found through research that the refraction phenomenon has high light extraction efficiency for light, but a color shift of the display panel will be caused since an optical path of light in the display panel is increased; while total reflection has little effect on the optical path of light, and the effect of color shift is small, but the light extraction ability of the display panel is limited. Based on this, in the present application, by adjusting the proportion of the refraction phenomenon and total reflection phenomenon of light at the interface of the light extraction unit, on one hand, the light extraction efficiency of the display panel can be guaranteed, and on the other hand, it can avoid the increase of optical path of light caused by light extraction and thus avoid affecting the display effect. First, the difference between the refractive index of the first sub-unit 08 and the refractive index of the second sub-unit 09 should not be too small, such as $\Delta n \geq 0.17$, to avoid the color shift of the display panel and thus avoid affecting the display quality of the display panel; secondly, the difference between the refractive index of the first sub-unit 08 and the refractive index of the second sub-unit 09 $\Delta n \leq 0.25$, which ensures a certain proportion of refraction phenomenon and ensures the light extraction efficiency of the display panel, and if the refractive index of the second sub-unit 09 and the refractive index of the first sub-unit 08 are too large, when the external ambient light enters the second sub-unit 09 and the first sub-unit 08, the reflection of the ambient light will be enhanced, which reduces the anti-reflection ability of the display panel; by balancing the proportion of the reflection phenomenon and refraction display of light in the light modulation unit, the light extraction efficiency of the display panel 00 is improved, and the anti-reflection capability of the display panel is ensured, which improves the display quality.

Optionally, the difference between the refractive index of the first sub-unit 08 and the refractive index of the second sub-unit 09 $\Delta n = 0.21$. The difference between the refractive index of the first sub-unit 08 and the refractive index of the second sub-unit of the light extraction unit is 0.21, which is relatively easy to achieve from a technological point of view, and can balance the proportion of the reflection phenomenon and refraction display of light in the light modulation unit, improve the light extraction efficiency of the display panel 00, and can ensure the anti-reflection capability of the display panel and improve the display quality.

Figure 2:
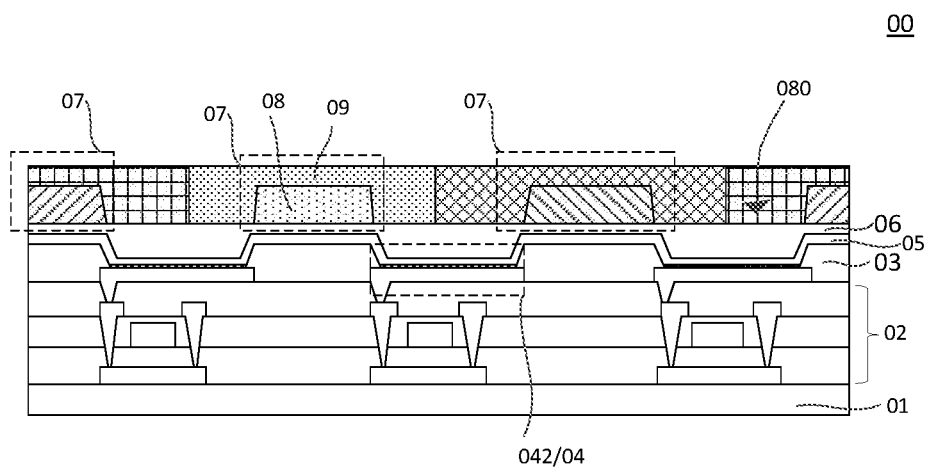
FIG. 2 is a schematic diagram of another optional implementation of a display panel provided by an embodiment of the present application.

FIG. 2 is a schematic diagram of another optional implementation of a display panel provided by an embodiment of the present application. Referring to FIG. 1 and FIG. 2, which are schematic cross-sectional views in a direction perpendicular to the substrate 01, the first sub-units 08 of the light extraction units 07 have different shapes. In FIG. 2, a cross-sectional shape of the first sub-unit 08 is a trapezoid, a surface area of the first sub-unit 08 on a side away from the substrate 01 is smaller than a surface area of the first sub-unit 08 on a side close to the substrate, a side contact area between the second sub-unit 09 and the first sub-unit 08 is increased, an effective working interface of the light extraction unit for light is increased, and the light extraction efficiency is improved; and the surface area of the first sub-unit 08 on a side away from the substrate 01 is relatively small, in the direction perpendicular to the substrate 01, the first sub-unit 08 do not overlap with the light-emitting unit 04, and the first sub-unit 08 will not affect the light of the light-emitting unit 04 at the front viewing angle. In FIG. 1, a surface of the first sub-unit 08 is a certain arc surface, which can not only achieve light extraction, but also reduce the difficulty of the process.

Optionally, continuing to refer to FIG. 1 and FIG. 2, an orthographic projection of the first sub-unit 08 on the substrate 01 falls within an orthographic projection range of the pixel definition layer 03 on the substrate 01, and the orthographic projection of the first sub-unit 08 on the substrate 01 does not overlap with an orthographic projection of the light-emitting unit 04 on the substrate 01.

Optionally, the first sub-unit 08 includes a light extraction angle θ and a first sidewall 08X close to the light extraction opening 080, and a maximum angle between the first sidewall 08X and a plane where the substrate 01 is located is a light extraction angle θ, wherein $$\left(\sin\frac{n1}{n2} - 11°\right) \le \theta \le \sin\frac{n1}{n2}.$$

Figure 3:
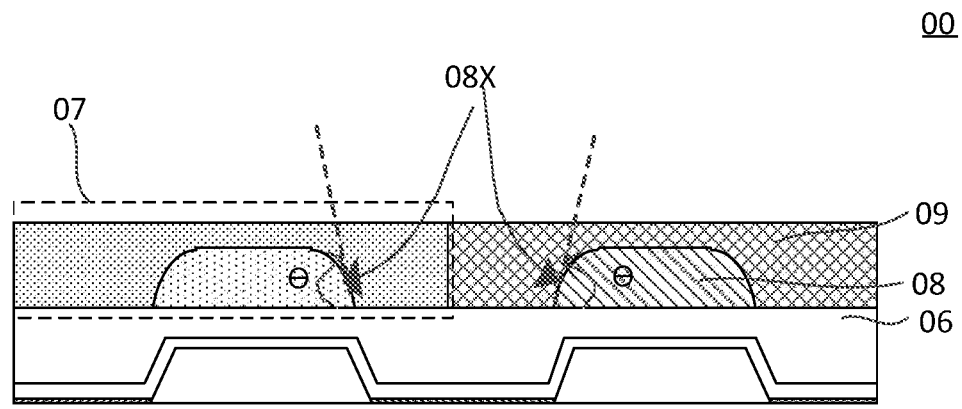
FIG. 3 is a schematic diagram of another optional implementation of a display panel provided by an embodiment of the present application.
Figure 4:
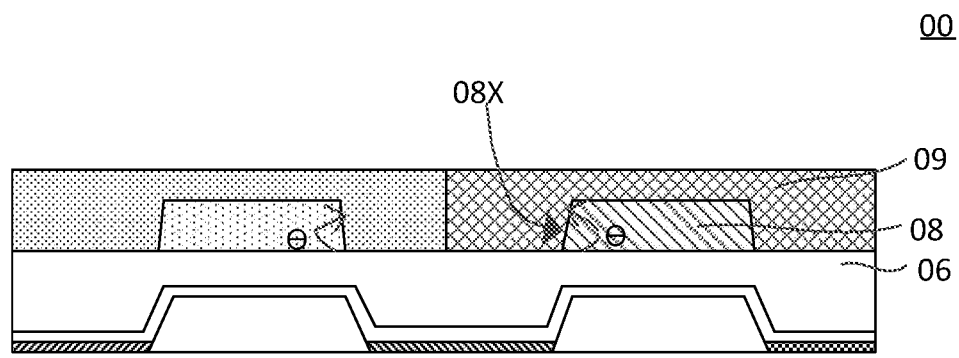
FIG. 4 is a schematic diagram of another optional implementation of a display panel provided by an embodiment of the present application.

FIG. 3 is a schematic diagram of another optional implementation of a display panel provided by an embodiment of the present application. FIG. 4 is a schematic diagram of another optional implementation of a display panel provided by an embodiment of the present application. As shown in FIGS. 3-4, the first sub-unit 08 includes a light extraction angle θ and a first sidewall 08X close to the light extraction opening 080, and a maximum angle between the first sidewall 08X and a plane where the substrate 01 is located is a light extraction angle θ, wherein $$\left(\sin\frac{n1}{n2} - 11°\right) \le \theta \le \sin\frac{n1}{n2},$$

where n1 is the refractive index of the first sub-unit 08, and n2 is the refractive index of the second sub-unit 09. The applicants have found through research that if the light extraction angle θ is relatively small, then at the interface between the first sub-unit 08 and the second sub-unit 08 of the light extraction unit 07, a proportion of the refraction phenomenon of light is greater than a proportion of total reflection phenomenon of light; in contrast, if the light extraction angle θ is relatively large, then at the interface between the first sub-unit 08 and the second sub-unit 08 of the light extraction unit 07, the proportion of the refraction phenomenon of light is smaller than the proportion of the total reflection phenomenon of light. Compared with the prior art, in this embodiment, the maximum angle between the first sidewall 08X and the plane where the substrate 01 is located is limited within a certain range. On one hand, the light extraction angle $$\theta \ge \left(\sin\frac{n1}{n2} - 11°\right),$$

which can ensure that the light extraction unit has a reflection phenomenon at a light action interface, avoid the color shift of the display panel due to the refraction phenomenon, and from a technological point of view, a cost of a light extraction angle that is too small will increase exponentially, and in this embodiment, $$\theta \ge \left(\sin\frac{n1}{n2} - 11°\right)$$

can save the process cost effectively; on the other hand, in this embodiment, $$\theta \le \sin\frac{n1}{n2},$$

which can ensure mat the light extraction unit has a certain proportion of refraction phenomenon at the light action interface, to avoid low light extraction efficiency, to avoid reducing light extraction efficiency, and increasing power consumption of the display panel.

It should be noted that, as shown in FIG. 3, when the first sidewall 08X of the display panel 00 is a curved surface, the light extraction angle θ is the maximum angle between the first sidewall 08X and the plane where the substrate 01 is located; as shown in FIG. 4, when the first sidewall 08X of the display panel 00 is a plane, an angle between the first sidewall 08X and the plane where the substrate 01 is located is a fixed value, and at this time, the light extraction angle θ can be understood as the angle between the first sidewall 08X and the plane where the substrate 01 is located.

Optionally, an average value of light extraction angles θ in the display panel 00 is θ', wherein θ'=52°. In this embodiment, the average value of light extraction angles in the display panel 00 is 52°, which can ensure an overall display efficiency of the display panel. Further, the average value of light extraction angles θ corresponding to all the light-emitting units 04 of the same color is 52°, that is to say, the average value of light extraction angles θ corresponding to each light-emitting unit 04 with the same light-emitting color in the display panel 00 is 52°. Optionally, n2=1.68, n1=1.47.

Optionally, the light extraction units includes a first light extraction unit and a second light extraction unit, a difference between the refractive index of the first sub-unit of the first light extraction unit and the refractive index of the second sub-unit of the first light extraction unit is Δn1, a difference between the refractive index of the first sub-unit of the second light extraction unit and the refractive index of the second sub-unit of the second light extraction unit is Δn2; the light extraction angle of the first sub-unit in the first light extraction unit is a first light extraction angle θ1, and the light extraction angle of the first sub-unit in the second light extraction unit is a second light extraction angle θ2, wherein, (Δn1−Δn2)·(θ1−θ2)<0.

Figure 5:
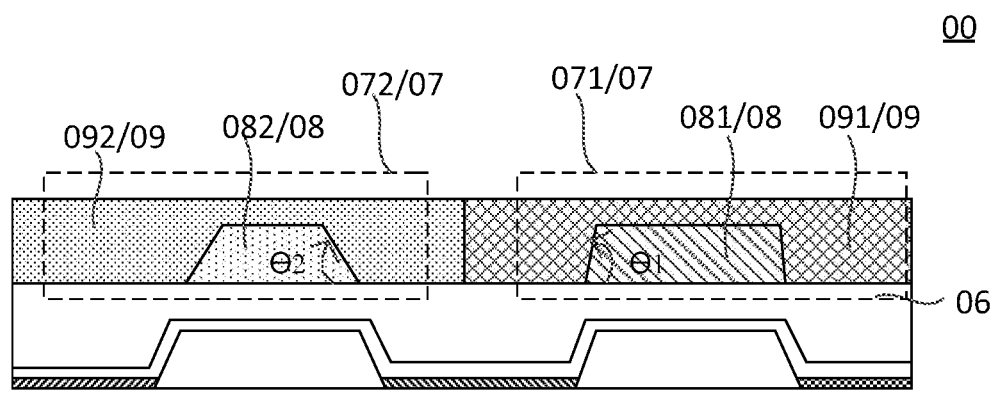
FIG. 5 is a schematic diagram of another optional implementation of a display panel provided by an embodiment of the present application.

FIG. 5 is a schematic diagram of another optional implementation of a display panel provided by an embodiment of the present application. As shown in FIG. 5, the light extraction unit 07 includes a first light extraction unit 071 and a second light extraction unit 072, a difference between the refractive index of the first sub-unit 081 of the first light extraction unit 071 and the refractive index of the second sub-unit 091 of the first light extraction unit 071 is Δn1, a difference between the refractive index of the first sub-unit 082 of the second light extraction unit 072 and the refractive index of the second sub-unit 092 of the second light extraction unit 072 is Δn2, the light extraction angle of the first sub-unit 081 in the first light extraction unit 071 is a first light extraction angle θ1, and the light extraction angle of the first sub-unit 082 in the second light extraction unit 072 is a second light extraction angle θ2, wherein, (Δn1−Δn2)·(θ1−θ2)<0. That is to say, a difference between the refractive index of the first sub-unit 081 and the refractive index of the second sub-unit 091 in the first light extraction unit 071 is a first difference, a difference between the refractive index of the first sub-unit 082 and the refractive index of the second sub-unit 092 in the second light extraction unit 072 is a second difference, and when there is a difference between the first difference and the second difference, there must also be a difference between the first light extraction angle θ1 corresponding to the first light extraction unit 071 and the second light extraction angle θ2 corresponding to the second light extraction unit 072; and a light extraction structure corresponding to a light extraction unit with a larger difference in refractive index between the first sub-unit and the second sub-unit is smaller. In this embodiment, by arranging the first light extraction unit and the second light extraction unit, different light modulation structures can be made for light-emitting units of different areas, which is easier to implement in terms of technology; further, the applicants have found through research that the greater the difference between the refractive index of the first sub-unit and the refractive index of the second sub-unit in the light extraction unit, the smaller a corresponding optimal light extraction angle. In order to maximize the optimization of the light emitted by each light-emitting unit, the light extraction angle corresponding to a large difference in refractive index between the first sub-unit and the second sub-unit in the light extraction unit is small.

It should be noted that a relative positional relationship between the first light extraction unit 071 and the second light extraction unit 072 in this embodiment is not limited in the present application. Referring to FIG. 5, an orthographic projection of the first light extraction unit 071 on the substrate 01 and an orthographic projection of the second light extraction unit 072 on the substrate 01 are arranged adjacent to each other, and the adjacent arrangement of the two orthographic projections can ensure a flatness of a light adjustment structure, which is convenient for subsequent process. Optionally, the orthographic projection of the first light extraction unit 071 on the substrate 01 and the orthographic projection of the second light extraction unit 072 on the substrate 01 may also be overlapped, or there is a certain distance between the two projections and the distance is greater than zero.

Optionally, |Δn2−Δn1|=0.7 and |θ1−θ2|=5°. By adjusting the refractive index difference and light extraction angle of the first sub-unit and the second sub-unit in the light extraction unit, the light extraction unit can be in a most ideal light extraction state, which improves the light extraction efficiency of the display panel. However, from a technological point of view, the greater the refractive index difference and the greater the angle difference, the more difficult the process will be. For example, a larger difference in refractive index will lead to a significant difference in concentration of scattering particles filled in the light extraction layer or the cover layer, and a difficulty of adjusting the difference in light extraction angle in exposure and etching will increase, which will increase a production cost. In this embodiment, the difference in refractive index between the first sub-unit and the second sub-unit is 0.7, and the difference in light extraction angle is 5°, which will not increase the cost too much, and can ensure the light extraction efficiency of the display panel.

Optionally, the refractive index of the first sub-unit of the first light extraction unit is n11, the refractive index of the second sub-unit of the first light extraction unit is n12, the refractive index of the first sub-unit of the second light extraction unit is n21, and the refractive index of the second sub-unit of the second light extraction unit is n22; wherein n22=n12, the second sub-unit of the first light extraction unit and the second sub-unit of the second light extraction unit are in the same layer and are of the same material.

Figure 6:
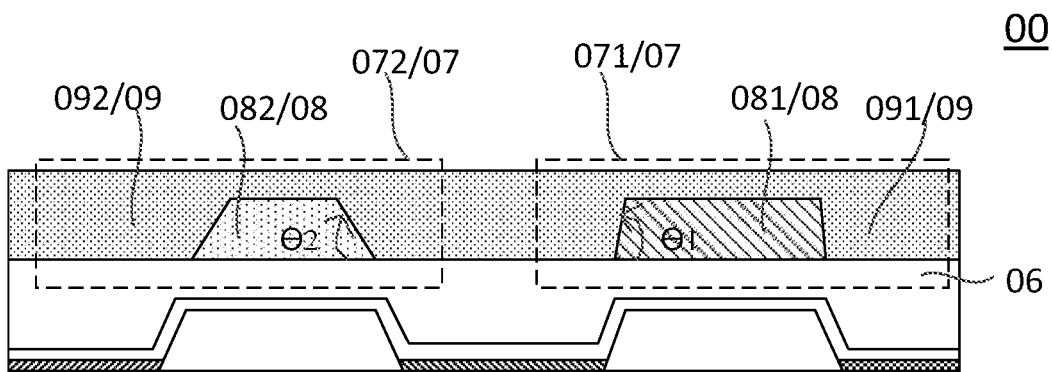
FIG. 6 is a schematic diagram of another optional implementation of a display panel provided by an embodiment of the present application.

As shown in FIG. 6, the refractive index of the first sub-unit 081 of the first light extraction unit 071 is n11, the refractive index of the second sub-unit 091 of the first light extraction unit 071 is n12, the refractive index of the first sub-unit 082 of the second light extraction unit 072 is n21, and the refractive index of the second sub-unit 092 of the second light extraction unit 072 is n22; wherein n22=n12, the second sub-unit 091 of the first light extraction unit 071 and the second sub-unit of 092 the second light extraction unit 072 are in the same layer and are of the same material. In this embodiment, based on the foregoing embodiments, in order to save costs, the second sub-units 09 in different light extraction units 07 are fabricated by the same process, which saves costs.

Continuing to refer to FIG. 6, (n11−n21)·(θ1−θ2)<0. It can be understood that when the second sub-units 09 in different light extraction units 07 are fabricated by the same process, that is, the second sub-unit 091 of the first light extraction unit 071 and the second sub-unit 092 of the second light extraction unit 072 are fabricated using the same process, at this time, the second sub-unit 091 of the first light extraction unit 071 and the second sub-unit 092 of the second light extraction unit 072 may be in the same film layer of the same material, and a light extraction angle in the light extraction units 07 corresponding to a first sub-unit having a large refractive index is small. Compared with the previous embodiments, in this embodiment, the second sub-units of different light extraction units are fabricated by the same process, which can simplify the process and save costs; further, the applicants have found through research that, the difference in refractive index between the first sub-unit and the second sub-unit in the light extraction unit differs, a corresponding optimal light extraction angle also differs, and they are positively correlated; by arranging a light extraction angle corresponding to a light extraction unit with a large difference in refractive index between the first sub-unit and the second sub-unit to be large, it can ensure that each light extraction unit is in a more efficient light extraction capability, and light extraction of optimal efficiency for the light emitted by each light-emitting unit can be obtained.

The refractive index of the second sub-unit 091 of the first light extraction unit 071 is n12, the refractive index of the second sub-unit 092 of the second light extraction unit 072 is n22, n12=n22, optionally, if a difference (n11−n12) between the refractive index n11 of the first sub-unit 081 of the first light extraction unit 071 and the refractive index n12 of the first sub-unit 082 of the second light extraction unit 072 is greater than zero, then a difference (θ1−θ2) between the first light extraction angle θ1 and the second light extraction angle θ2 is less than zero; if the difference (n11-n12) between the refractive index n11 of the first sub-unit 081 of the first light extraction unit 071 and the refractive index n12 of the first sub-unit 082 of the second light extraction unit 072 is less than is zero, then the difference (θ1−θ2) between the first light extraction angle θ1 and the second light extraction angle θ2 is greater than zero.

Optionally, the refractive index of the first sub-unit of the first light extraction unit is n11, the refractive index of the second sub-unit of the first light extraction unit is n12, the refractive index of the first sub-unit of the second light extraction unit is n21, and the refractive index of the second sub-unit of the second light extraction unit is n22; wherein n11=n21, the first sub-unit of the first light extraction unit and the first sub-unit of the second light extraction unit are in the same layer and are of the same material.

Figure 7:
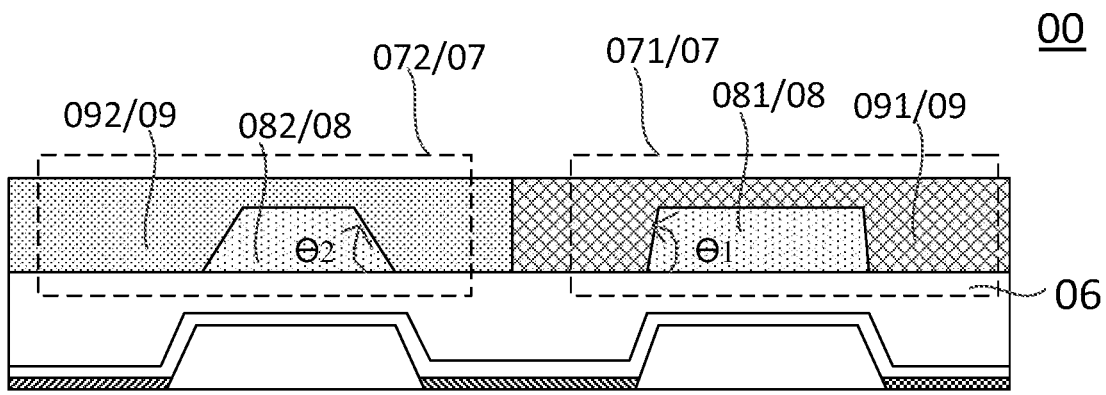
FIG. 7 is a schematic diagram of another optional implementation of a display panel provided by an embodiment of the present application.

FIG. 7 is a schematic diagram of another optional implementation of a display panel provided by an embodiment of the present application. As shown in FIG. 7, the refractive index of the first sub-unit 081 of the first light extraction unit 071 is n11, the refractive index of the second sub-unit 091 of the first light extraction unit 071 is n12, the refractive index of the first sub-unit 082 of the second light extraction unit 072 is n21, and the refractive index of the second sub-unit 092 of the second light extraction unit 072 is n22; wherein n11=n21, the first sub-unit 081 of the first light extraction unit 071 and the first sub-unit 082 of the second light extraction unit 072 are in the same layer and are of the same material. The first sub-units 08 in different light extraction units 07 are fabricated by the same process, and the first sub-units in different light extraction units are fabricated at one time, which simplifies the process and saves costs.

Continuing to refer to FIG. 6, (n21−n22)·(θ1−θ2)>0. It can be understood that when the first sub-units 08 in different light extraction units 07 are fabricated by the same process, that is, the first sub-unit 081 of the first light extraction unit 071 and the first sub-unit 082 of the second light extraction unit 072 are fabricated using the same process, at this time, a light extraction angle in the light extraction units 07 corresponding to a second sub-unit having a large refractive index is large. Compared with the prior art, in this embodiment, the first sub-units of different light extraction units are fabricated by the same process, which can simplify the process and save costs; further, the applicants have found through research that, the difference in refractive index between the sub-unit and the second sub-unit in the light extraction unit differs, a corresponding optimal light extraction angle also differs, and they are positively correlated; by arranging a light extraction angle corresponding to a light extraction unit with a small difference in refractive index between the first sub-unit and the second sub-unit to be small, it can ensure that each light extraction unit is in a more efficient light extraction capability, and light extraction of optimal efficiency for the light emitted by each light-emitting unit can be obtained.

The refractive index of the first sub-unit 081 of the first light extraction unit 071 is n11, the refractive index of the first sub-unit 082 of the second light extraction unit 072 is n21, n11=n21, optionally, if a difference (n12−n22) between the refractive index n12 of the second sub-unit 091 of the first light extraction unit 071 and the refractive index n22 of the second sub-unit 092 of the second light extraction unit 072 is greater than zero, then a difference (θ1−θ2) between the first light extraction angle θ1 and the second light extraction angle θ2 is greater than zero; if the difference (n12−n22) between the refractive index n12 of the second sub-unit 091 of the first light extraction unit 071 and the refractive index n22 of the second sub-unit 092 of the second light extraction unit 072 is less than is zero, then the difference (θ1−θ2) between the first light extraction angle θ1 and the second light extraction angle θ2 is less than zero.

Figure 8:
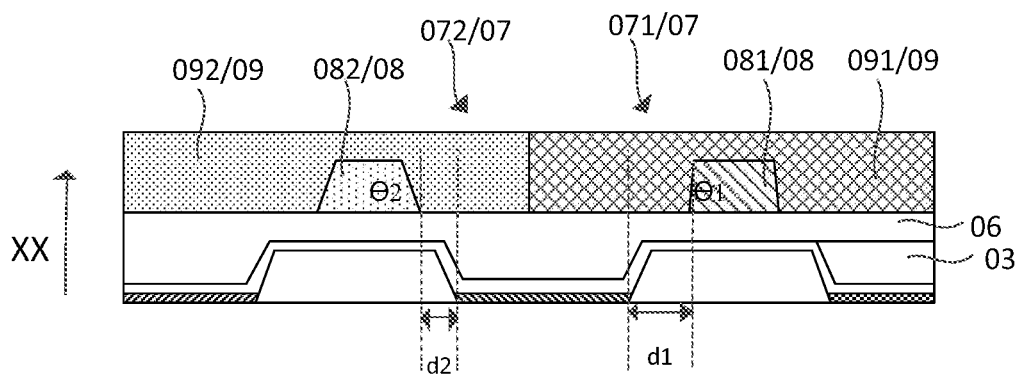
FIG. 8 is a schematic diagram of another optional implementation of a display panel provided by an embodiment of the present application.
Figure 9:
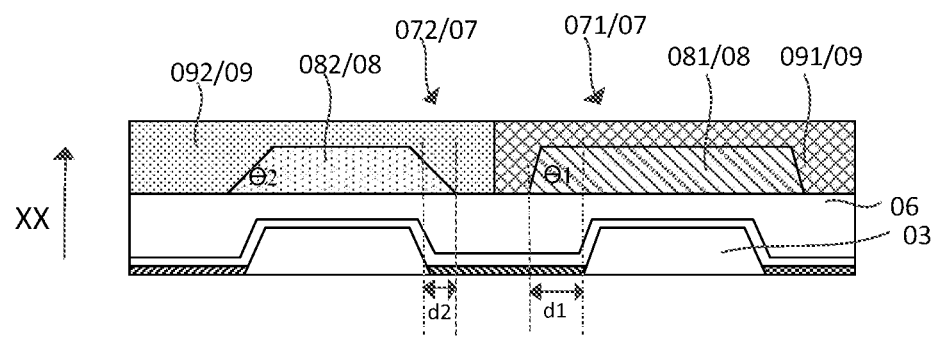
FIG. 9 is a schematic diagram of another optional implementation of a display panel provided by an embodiment of the present application.
Figure 10:
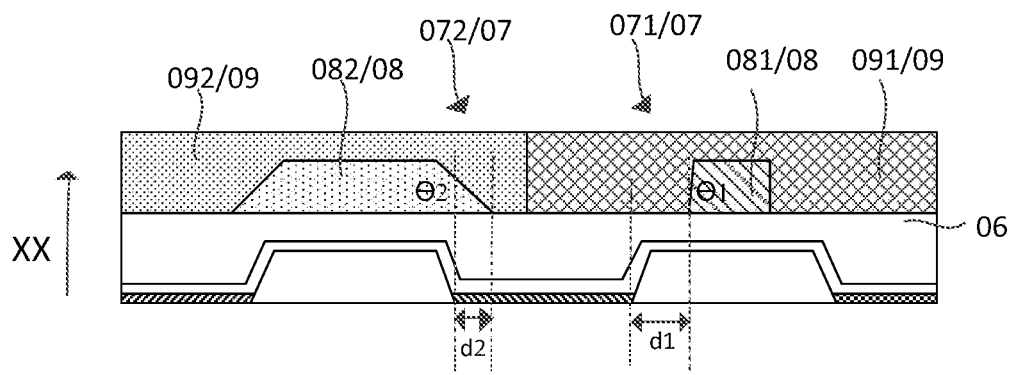
FIG. 10 is a schematic diagram of another optional implementation of a display panel provided by an embodiment of the present application.
Figure 11:
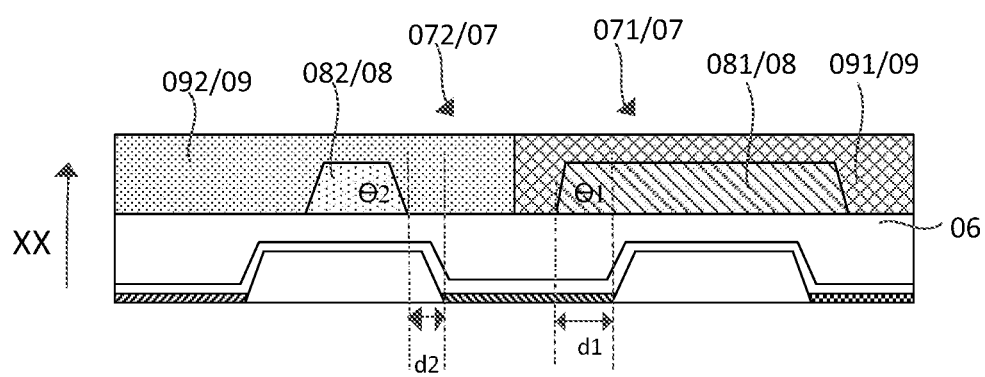
FIG. 11 is a schematic diagram of another optional implementation of a display panel provided by an embodiment of the present application.

FIG. 8 is a schematic diagram of another optional implementation of a display panel provided by an embodiment of the present application. FIG. 9 is a schematic diagram of another optional implementation of a display panel provided by an embodiment of the present application. FIG. 10 is a schematic diagram of another optional implementation of a display panel provided by an embodiment of the present application. FIG. 11 is a schematic diagram of another optional implementation of a display panel provided by an embodiment of the present application. As shown in FIGS. 8-11, the light extraction units 07 includes a first light extraction unit 071 and a second light extraction unit 072, the light extraction angle of the first sub-unit 081 in the first light extraction unit 071 is a first light extraction angle θ1, and the light extraction angle of the first sub-unit 082 in the second light extraction unit 072 is a second light extraction angle θ2, θ1>θ2; in a direction XX perpendicular to the substrate (not shown in the figures), a shortest distance from an edge of the first sub-unit 081 to an edge of a pixel opening corresponding to the first sub-unit is an opening distance, the opening distance corresponding to the first sub-unit 081 of the first light extraction unit 071 is a first opening distance d1, and the opening distance corresponding to the first sub-unit 082 of the second light extraction unit 072 is a second opening distance d2, wherein |d1|>|d2|. Compared with the prior art, in this embodiment, the opening distance of the light extraction unit corresponding to a small light extraction angle is small, and the light extraction angle is positively correlated with the opening distance. For a first sub-unit with a large light extraction angle, there is a certain offset effect in a fabrication process, and the applicants have found that the larger the light extraction angle, the smaller an offset of a position of a corresponding first sub-unit during fabrication. Based on this, the opening distance of the light extraction unit with a relatively small light extraction angle is set to be relatively small, which can reduce a light fluctuation of a relatively large light extraction angle, balance a process offset fluctuation of a large light extraction angle and a small light extraction angle, and allow light extraction efficiency of light extraction units corresponding to different light extraction angles to be balanced.

Optionally, d1>d2≥0 or d1<d2≤0, the opening distance being a positive value indicates that the pixel opening does not overlap with the first sub-unit in the direction perpendicular to the substrate, the opening distance being a negative value indicates that the pixel opening overlaps with the first sub-unit in the direction perpendicular to the substrate, and the opening distance being equal to zero indicates that the first sub-unit is adjacent to the pixel opening in the direction perpendicular to the substrate. Continuing to refer to FIG. 8, the first opening distance d1 and the second opening distance d2 are both positive values, that is to say, in the direction XX perpendicular to the substrate, the first sub-unit 081 of the first light extraction unit 071 and the pixel opening do not overlap, the first sub-unit 082 of the second light extraction unit 072 and the pixel opening do not overlap, and d1 is greater than d2, namely, the distance from the first sub-unit 081 of the first light extraction unit 071 to the pixel opening is larger. Continuing to refer to FIG. 9, the first opening distance d1 and the second opening distance d2 are both negative values, that is to say, in the direction XX perpendicular to the substrate, the first sub-unit 081 of the first light extraction unit 071 and the pixel opening overlap, the first sub-unit 082 of the second light extraction unit 072 and the pixel opening overlap, and d1 is smaller than d2, namely, the distance from the first sub-unit 081 of the first light extraction unit 071 to the pixel opening is larger. Optionally, d2=0, in other words, an orthographic projection of the first sub-unit 082 of the second light extraction unit 072 on the substrate is adjacent to an orthographic projection of the pixel opening on the substrate, and the two projections have the same edge.

Optionally, d$1$>−d$2$≥0 or −d$1$>d$2$≥0; the opening distance being a positive value indicates that the pixel opening does not overlap with the first sub-unit 08 in the direction perpendicular to the substrate, the opening distance being a negative value indicates that the pixel opening overlaps with the first sub-unit 08 in the direction perpendicular to the substrate, and the opening distance being equal to zero indicates that the first sub-unit is adjacent to the pixel opening in the direction perpendicular to the substrate. Referring to FIG. 10, the first opening distance d1 is greater than zero, an orthographic projection of the first sub-unit 081 of the first light extraction unit 071 on the substrate does not overlap with an orthographic projection of the corresponding pixel opening on the substrate, and a shortest distance between the two projections is d1; the second opening distance d2 is less than zero, the first sub-unit 082 of the second light extraction unit 072 overlaps with the pixel opening, and an overlapping width is d2; wherein, d$1$>−d$2$≥0. Compared with the prior art, this embodiment can reduce a light fluctuation of a relatively large light extraction angle, balance a process offset fluctuation of a large light extraction angle and a small light extraction angle, and allow light extraction efficiency of light extraction units corresponding to different light extraction angles to be balanced.

Referring to FIG. 11, the first opening distance d1 is less than zero, the first sub-unit 081 of the first light extraction unit 071 overlaps with the pixel opening, and an overlapping width is d1; the second opening distance d2 is greater than zero, the first sub-unit 082 of the second light extraction unit 072 does not overlap with the pixel opening, an orthographic projection of the first sub-unit 082 of the second light extraction unit 072 on the substrate does not overlap with an orthographic projection of the corresponding pixel opening on the substrate, and a shortest distance between the two projections is d2, wherein, −d$1$>d$2$≥0, which can reduce a light fluctuation of a relatively large light extraction angle, balance a process offset fluctuation of a large light extraction angle and a small light extraction angle, and allow light extraction efficiency of light extraction units corresponding to different light extraction angles to be balanced.

Optionally, the light-emitting units includes a first color light-emitting unit and a second color light-emitting unit, a light-emitting efficiency of the first color light-emitting unit is lower than a light-emitting efficiency of the second color light-emitting unit, a light extraction unit corresponding to the first color light-emitting unit is a first sub-light extraction unit, a light extraction unit corresponding to the second color light-emitting unit is a second sub-light extraction unit, and the first sub-light extraction unit is different from the second sub-light extraction unit.

Figure 12:
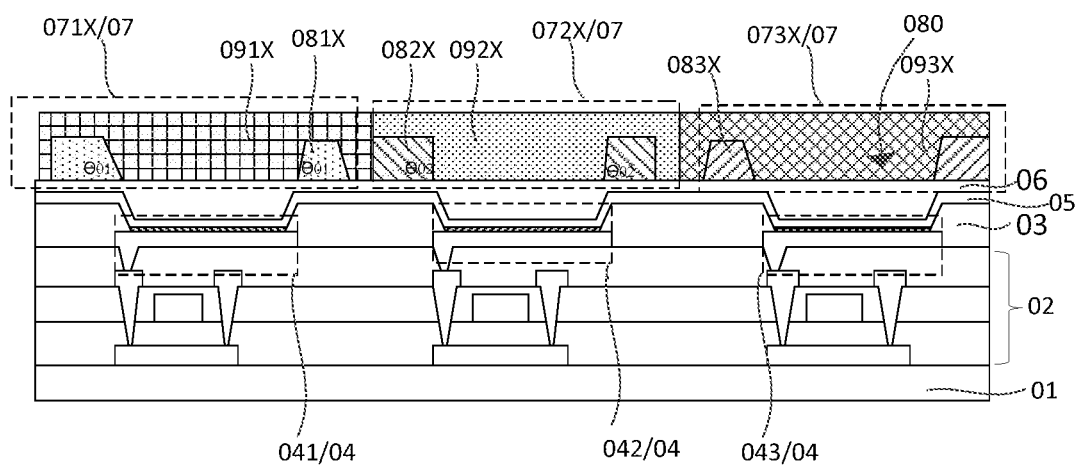
FIG. 12 is a schematic diagram of another optional implementation of a display panel provided by an embodiment of the present application.

FIG. 12 is a schematic diagram of another optional implementation of a display panel provided by an embodiment of the present application. Referring to FIG. 12, the light-emitting units 04 includes a first color light-emitting unit 041 and a second color light-emitting unit 042, a light-emitting efficiency of the first color light-emitting unit 041 is lower than a light-emitting efficiency of the second color light-emitting unit 042. When the light-emitting efficiency of the first color light-emitting unit 041 is lower than the light-emitting efficiency of the second color light-emitting unit 042, an intensity of the light emitted by the corresponding first color light-emitting unit 041 is relatively weak, which affects display, or in order to increase the light-emitting efficiency of the first color light-emitting unit 041, a current density through the first color light-emitting unit will be increased, however, this reduces a lifetime of the first color light-emitting unit. Further, a light extraction unit corresponding to the first color light-emitting unit 041 is a first sub-light extraction unit 071X, a light extraction unit corresponding to the second color light-emitting unit 042 is a second sub-light extraction unit 072X, and the first sub-light extraction unit 071X is different from the second sub-light extraction unit 072X. In this embodiment, in order to balance the light extraction efficiency of the first color light-emitting unit and the second color light-emitting unit and reduce the color shift, the first sub-light extraction unit 071X and the second sub-light extraction units 072X are set to be different, that is, the first sub-light extraction unit 071X and the second sub-light extraction unit 072X have different light extraction capabilities for the light-emitting units, so as to balance the light-emitting efficiency of the first color light-emitting unit and the second color light-emitting unit, so that the display panel emits light evenly and improves the display quality.

Optionally, a difference between the refractive index of the first sub-unit 081X of the first sub-light extraction unit 071X and the refractive index of the second sub-unit 091X of the first sub-light extraction unit 071X is Δn01, and a difference between the refractive index of the first sub-unit 082X of the second sub-light extraction unit 072X and the refractive index of the second sub-unit 092X of the second sub-light extraction unit 072X is Δn02; the light extraction angle of the first sub-unit 081X in the first sub-light extraction unit 071X is a first sub-light extraction angle θ01, and the light extraction angle of the first sub-unit 082X in the second sub-light extraction unit 072X is a second sub-light extraction angle θ02, wherein, Δn01=Δn02 and |θ01−52°|<|θ02−52°|. The difference between the refractive index of the first sub-unit 081X of the first sub-light extraction unit 071X and the refractive index of the second sub-unit 091X of the first sub-light extraction unit 071X is equal to the difference between the refractive index of the first sub-unit 082X of the second sub-light extraction unit 072X and the refractive index of the second sub-unit 092X of the second sub-light extraction unit 072X is Δn02, a value of the first sub-light extraction angle θ01 is closer to 52°; the applicants have found through research that the closer the light extraction angle is to 52°, the better the light extraction efficiency of the light extraction unit for the light-emitting units is. In this embodiment, the light extraction angle θ01 of the first sub-light extraction unit 071X is closer to 52°, which can be fine-tuned through the light extraction structure to improve the light extraction efficiency of the first color light-emitting unit 041, so that the light extraction capability of the first sub-light extraction unit 071X is greater than that of the second sub-light extraction unit 072X, which solves a problem of low light-emitting efficiency of the first color light-emitting unit, and improves the display quality.

Optionally, continuing to refer to FIG. 12, the light-emitting units 04 further include a third color light-emitting unit 043, the first color is blue, the second color is red, the third color is green, a light extraction unit corresponding to the third color light-emitting unit 043 is a third sub-light extraction unit 073X, a light extraction efficiency of the third sub-light extraction unit 073X is lower than a light extraction efficiency of the second sub-light extraction unit 072X, and a light extraction efficiency of the second sub-light extraction unit 072X is smaller than a light extraction efficiency of the first sub-light extraction unit 071X.

Optionally, continuing to refer to FIG. 12, a difference between the refractive index of the first sub-unit 081X of the first sub-light extraction unit 071X and the refractive index of the second sub-unit 091X of the first sub-light extraction unit 071X is Δn01, and a difference between the refractive index of the first sub-unit 082X of the second sub-light extraction unit 072X and the refractive index of the second sub-unit 092X of the second sub-light extraction unit 072X is Δn02; the light extraction angle of the first sub-unit 081X in the first sub-light extraction unit 071X is a first sub-light extraction angle θ01, and the light extraction angle of the first sub-unit 082X in the second sub-light extraction unit 072X is a second sub-light extraction angle θ02, wherein, 45°≤θ01=θ02≤55° and |Δn01−0.21|≤|Δn02−0.21|. In this embodiment, the first light extraction angle θ01 is equal to the second light extraction angle θ02, and the difference between the refractive index of the first sub-unit 081X of the first sub-light extraction unit 071X and the refractive index of the second sub-unit 091X of the first sub-light extraction unit 071X is closer to 0.21. The applicants have further found through research that, when the refractive index difference between the first sub-unit and the second sub-unit in the light extraction unit is about 0.21, not only a light extraction effect of light is good, but also it can ensure that a reflection of ambient light is within a controllable range, thereby ensuring an anti-reflection ability of the display panel; in this embodiment, the difference between the refractive index of the first sub-unit of the first sub-light extraction unit and the refractive index of the second sub-unit of the first sub-light extraction unit is closer to 0.21, which can be fine-tuned through the light extraction structure to improve the light extraction efficiency of the first color light-emitting unit 041, so that the light extraction capability of the first sub-light extraction unit 071X is greater than that of the second sub-light extraction unit 072X, which solves a problem of low light-emitting efficiency of the first color light-emitting unit, and improves the display quality.

Figure 13:
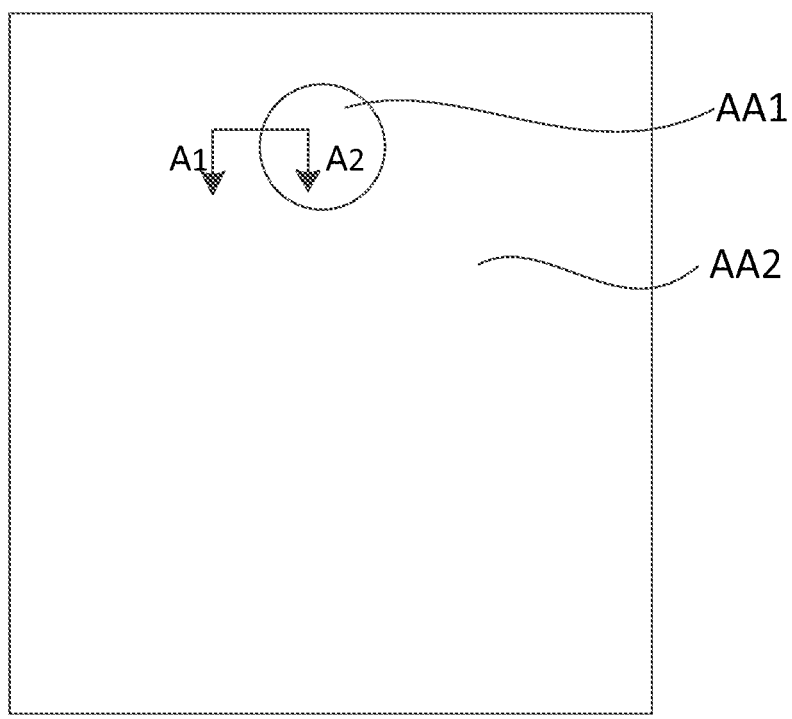
FIG. 13 is a schematic diagram of another optional implementation of a display panel provided by an embodiment of the present application.
Figure 14:
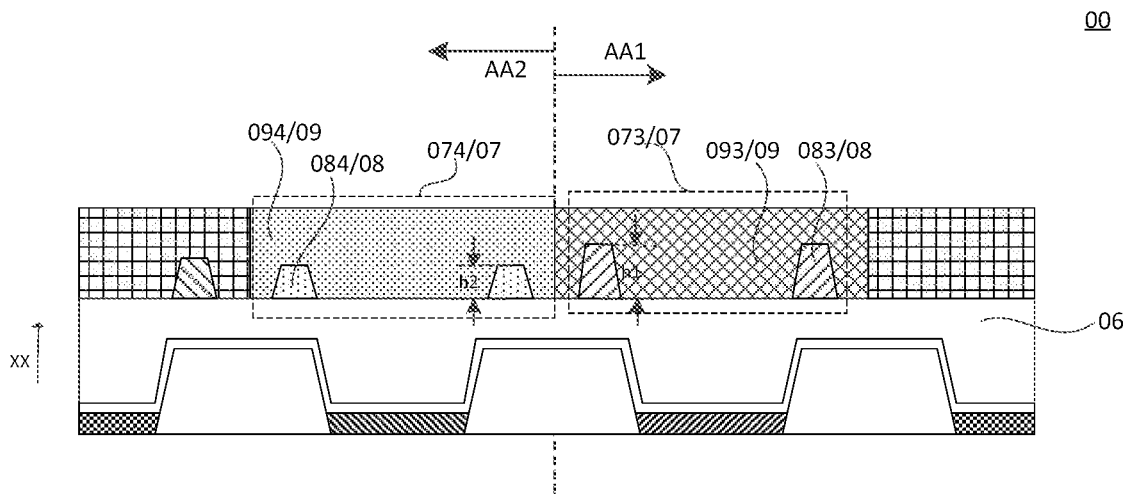
FIG. 14 is a schematic cross-sectional view of an optional embodiment at $A_1A_2$ of FIG. 13.

FIG. 13 is a schematic diagram of another optional implementation of a display panel provided by an embodiment of the present application. FIG. 14 is a schematic cross-sectional view of an optional embodiment at $A_1A_2$ of FIG. 13. Referring to FIGS. 13-14, in the direction XX perpendicular to the substrate, a thickness of the first sub-unit 08 of the light extraction unit 07 is a light extraction thickness; the display panel 00 includes a first display area AA1 and a second display area AA2, a light transmittance of the first display area AA1 is greater than a light transmittance of the second display area AA2. The light-emitting units in the first display area AA1 may be distributed more sparsely than the light-emitting units in the second display area AA2, so that a spacing between adjacent light-emitting units in the first display area AA1 is greater than a spacing between adjacent light-emitting units in the second display area AA2, thereby achieving that the light transmittance of the first display area AA1 is greater than that of the second display area AA2. Alternatively, a size of each of the light-emitting units in the first display area AA1 is smaller than that of each of the light-emitting units in the second display area AA2, so that when the spacing between adjacent light-emitting units in the first display area AA1 is consistent with the spacing between adjacent light-emitting units in the second display area AA2, the light transmittance of the first display area AA1 being greater than the light transmittance of the second display area AA2 is achieved. Compared with the second display area, the first display area AA1 is away from a side of the display panel 00 with a light-emitting surface, and is more suitable for arranging photosensitive components such as cameras to sense the light emitted from a backlight side through the display panel 00 from the side of the display panel 00 with the light-emitting surface. Therefore, since a pixel density of the first display area AA1 is smaller than that of the second display area AA2, or a pixel size of the first display area AA1 is smaller than that of the second display area AA2, a display brightness of the first display area AA1 will be lower than that of the second display area AA2.

Further, in order to solve the above problems, the light extraction units 071 include a third light extraction unit 073 and a fourth light extraction unit 074, the third light extraction unit 073 is arranged corresponding to a light-emitting unit of the first display area AA1, and the fourth light extraction unit 074 is arranged corresponding to a light-emitting unit of the second display area AA2. The third light extraction unit 073 includes a first sub-unit 083 and a second sub-unit 093, and the fourth light extraction unit 074 includes a first sub-unit 084 and a second sub-unit 094. It can be understood that the third light extraction unit 073 is located in the first display area AA1, and the fourth light extraction unit 074 is located in the second display area AA2. The light extraction thickness of the third light extraction unit is a first light extraction thickness h1, and the light extraction thickness of the fourth light extraction unit is a second light extraction thickness h2, wherein h1 is greater than h2. The applicants have found through research that increasing the light extraction thickness can increase the light extraction capability of the light extraction unit and increase the light extraction efficiency. The light extraction thickness of the fourth light extraction unit is smaller than the light extraction thickness of the third light extraction unit. Compared with the prior art, the first light extraction thickness h1 of the third light extraction unit 073 in the first display area AA1 is increased, and compared with the second light extraction thickness h2, h1 is greater than h2, and the light extraction capability of the third light extraction unit 073 is greater than that of the fourth light extraction unit 074, which can ensure the light-emitting efficiency of the light-emitting units in the first display area AA1 of the display panel 00, so that a brightness of the first display area AA1 and a brightness of the second display area AA2 are consistent, which improves the user perception.

Optionally, a material of the second sub-unit may be acrylic, for example, metal oxide nanoparticles with high refractive index are mixed into epoxy resin materials, and the metal oxide nanoparticles may be zirconium oxide ($ZrO_2$) or titanium oxide ($TiO_2$). A hardness of the second refractive sub-unit can be increased by increasing a curing energy used in a fabrication process of the second refractive sub-unit, or by increasing a content of metal oxide nanoparticles in the epoxy resin materials.

Figure 15:
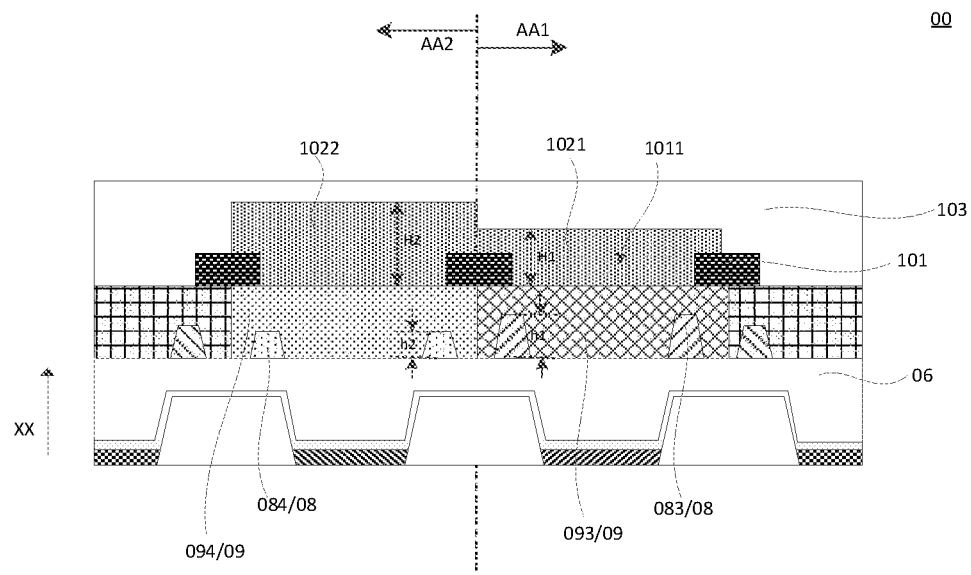
FIG. 15 is a schematic cross-sectional view of an optional embodiment at $A_1A_2$ of FIG. 13.

FIG. 15 is a schematic cross-sectional view of an optional embodiment at $A_1A_2$ of FIG. 13. As shown in FIG. 15, the display panel 00 further includes a color filter film, wherein the color filter film includes black matrixes 101, matrix openings 1011 and color resistance units, one of the matrix openings 1011 corresponds to at least one of the light-emitting units, the color resistance units are located in the matrix openings 1011, a color of each of the color resistance units is the same as a color of a corresponding light-emitting unit; the color filter film is located on a side of the light-emitting units of the display panel 00 close to the light-emitting surface, and has a certain filter for the emitted light of the light-emitting units. A combination of color resistance units and black matrixes can replace a traditional polarizer, which is beneficial to reduce a thickness of the display panel and improve a bending resistance of the display panel. It should be noted that one traditional matrix opening 1011 corresponds to one light-emitting unit, and along the direction XX perpendicular to the substrate, the matrix opening 1011 overlaps with the light-emitting unit; of course, one matrix opening 1011 may also be arranged to overlap with a plurality of light-emitting units at the same time. Colors of the plurality of light-emitting units may be the same or different, which is not limited in the present application.

Continuing to refer to FIG. 15, a color resistance unit of the first display area AA1 is a first color resistance unit 1021, a color resistance unit of the second display area AA2 is a second color resistance unit 1022, wherein, in the direction XX perpendicular to the substrate, a maximum thickness of the first color resistance unit 1021 is H1, and a maximum thickness of the second color resistance unit 1022 having the same color as the first color resistance unit 1021 is H2, wherein H1<H2. The maximum thickness H1 of the first color resistance unit 1021 in the first display area AA1 is smaller than the maximum thickness H2 of the second color resistance unit 1022 in the second display area AA2. By reducing a thickness of the first color resistance unit 1021, a transmittance of the light emitted by the light-emitting unit of the first display area AA1 can be improved, a light-emitting efficiency of the light-emitting unit of the first display area AA1 of the display panel 00 can be improved, so that a brightness of the first display area AA1 and a brightness of the second display area AA2 can be consistent, which improves the user perception.

It should be noted that, a maximum thickness of a color resistance unit may be understood as an average thickness of the resistance unit at the pixel opening or where it overlaps with the light-emitting unit.

Optionally, the color filter film further includes a dielectric layer 103, which can provide a flat bearing surface for a next process of the panel.

Figure 16:
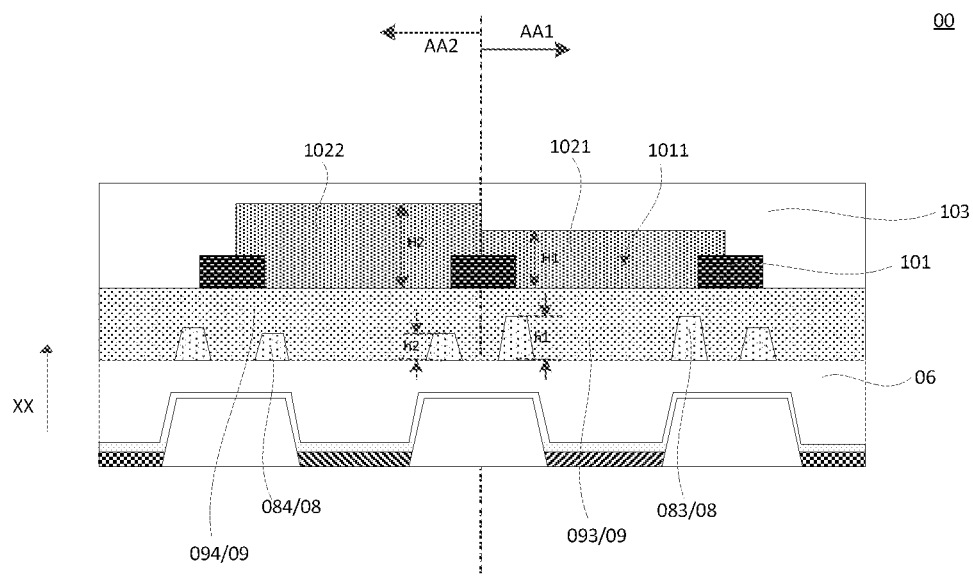
FIG. 16 is a schematic cross-sectional view of an optional embodiment at $A_1A_2$ of FIG. 13.

FIG. 16 is a schematic cross-sectional view of an optional embodiment at $A_1A_2$ of FIG. 13. As shown in FIG. 16, optionally, the first sub-unit 083 of the third light extraction unit is made of the same material as the first sub-unit 084 of the fourth light extraction unit, the second sub-unit 093 of the third light extraction unit is made of the same material as the second sub-unit 094 of the fourth light extraction unit, and a uniform process is used to fabricate the film layer, which can simplify the process and save costs.

Optionally, the color resistance units are multiplexed into the second sub-units of the light extraction units, and in the direction perpendicular to the substrate, the first sub-units and the color resistance units have an overlapping area, and in the overlapping area, a thickness of the first color resistance unit is M1, a thickness of the second color resistance unit is M2, M1+h1=M2+h2.

Figure 17:
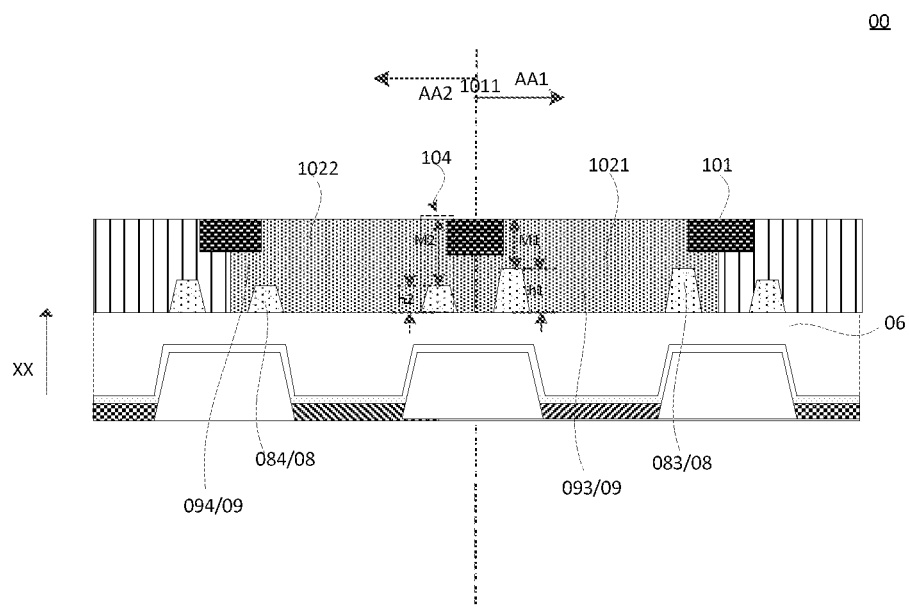
FIG. 17 is a schematic cross-sectional view of an optional embodiment at $A_1A_2$ of FIG. 13.

FIG. 17 is a schematic cross-sectional view of an optional embodiment at $A_1A_2$ of FIG. 13. Referring to FIG. 17, the color resistance unit 1021/1022 is multiplexed into the second sub-unit 09 of the light extraction unit. For example, the first color resistance unit 1021 is multiplexed into the second sub-unit 093 of the third light extraction unit, the second color resistance unit 1022 is multiplexed into the second sub-unit 094 of the fourth light extraction unit, which can save the process and reduce the thickness of the display panel. Continuing to refer to FIG. 17, in the direction XX perpendicular to the substrate, the first sub-unit 08 and the color resistance unit 1021/1022 have an overlapping area 101, and in the overlapping area 104, the thickness of the first color resistance unit 1021 is M1. The thickness of the second color resistance unit 1022 is M2, wherein M1+h1=M2+h2. Compared with the prior art, the first light extraction thickness h1 of the light extraction unit in the first display area AA1 is set to be larger than that of the light extraction unit in the second display area AA2, which can improve the light extraction efficiency of the first display area AA1, and at the same time, the maximum thickness of the first color resistance unit 1021 in the first display area AA1 is set to be smaller than the maximum thickness of the second color resistance unit 1022 in the second display area AA2, which can also improve the light extraction efficiency of the first display area AA1. Further, M1+h1=M2+h2, this reduces a level difference caused by the light modulation structure in the overlapping area 104, which can ensure that the thicknesses of the first display area AA1 and the thicknesses of the second display area AA2 are approximately equal, thereby ensuring that a surface on a side of the color filter layer away from the substrate has good flatness, which is beneficial to the fabrication process of a next step. Optionally, in this embodiment, the second sub-units with different refractive indices can be realized by using color resistance units of different colors, so the first sub-units for the light extraction units can be made of the same material, which saves costs.

Figure 18:
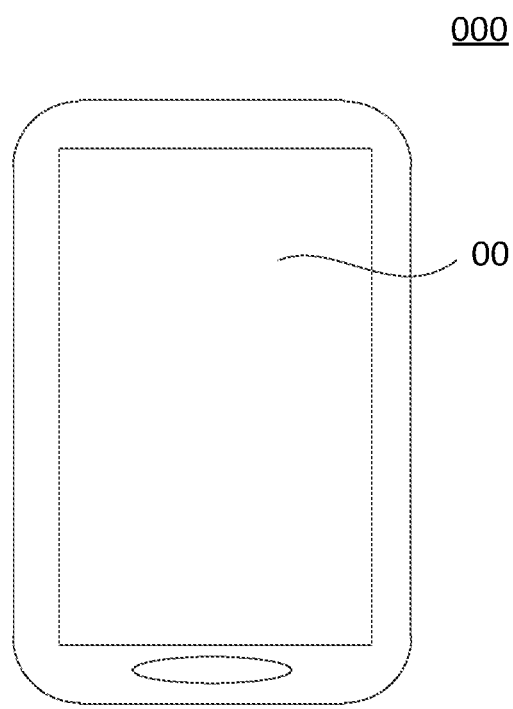
FIG. 18 is a schematic diagram of a display device according to an embodiment of the present application.

The present application further provides a display device, and FIG. 18 is a schematic diagram of a display device according to an embodiment of the present application. The display device 000 includes the display panel 00 provided by any embodiment of the present application. The display device provided by the present application includes but is not limited to the following categories: a television, a notebook computer, a desktop monitor, a tablet computer, a digital camera, a mobile phone, a smart bracelet, smart glasses, an on-board monitor, a medical device, an industrial control device, a touch interaction terminal, etc.

It can be seen from the above embodiments that the display panel and the display device provided by the present application at least achieve the following beneficial effects: the light modulation structure includes a plurality of light extraction units, and the light extraction units correspond to the light-emitting units, wherein the light extraction units can change a light path of the light that is originally emitted from the light-emitting units and cannot be normally emitted from the display panel; each of the light extraction units includes a first sub-unit and a second sub-unit, a refractive index of the first sub-unit is smaller than a refractive index of the second sub-unit, and using functions of total reflection and refraction of the light by the light extraction units, the light that cannot be normally emitted by the sub-units can be successfully emitted from the display panel, which improves the light extraction efficiency and display effect of the display panel.

The above contents are further detailed description of the present application in combination with specific preferred embodiments, and it cannot be considered that the specific implementation of the present application is only limited to these descriptions. For those of ordinary skill in the technical field of the present application, without departing from the concept of the present application, some simple deductions or substitutions can be made, which should be regarded as falling with the protection scope of the present application.

What is claimed is:

1. A display panel, comprising:
   a substrate;
   a pixel definition layer and light-emitting units, wherein the pixel definition layer is located on one side of the substrate, the pixel definition layer comprises a plurality of pixel openings, and the pixel openings are arranged corresponding to the light-emitting units;
   a light modulation structure comprising a light extraction layer and a cover layer, wherein the light extraction layer is located on a side of the cover layer close to the pixel definition layer, the light modulation structure comprises a plurality of light extraction units, a light extraction unit of the plurality of light extraction units comprises a first sub-unit and a second sub-unit, wherein the light extraction layer comprises a light extraction opening and the first sub-unit, first sub-units enclose the light extraction opening, the light extraction opening overlaps with the pixel openings, the second sub-unit is located in the cover layer, and a refractive index of the first sub-unit is smaller than a refractive index of the second sub-unit.

2. The display panel of claim 1, wherein,
   a difference between the refractive index of the first sub-unit and the refractive index of the second sub-unit is Δn, wherein,
   0.17≤Δn≤0.25.

3. The display panel of claim 2, wherein,
   Δn=0.21.

4. The display panel of claim 1, wherein,
   the first sub-unit comprises a light extraction angle and a first sidewall close to the light extraction opening, a maximum angle between the first sidewall and a plane where the substrate is located is the light extraction angle, the light extraction angle is θ, wherein, $$\left(\sin\frac{n1}{n2} - 11°\right) \le \theta \le \sin\frac{n1}{n2};$$

where n1 is the refractive index of the first sub-unit, and n2 is the refractive index of the second sub-unit.

5. The display panel of claim 4, wherein,
   an average value of light extraction angles in the display panel is θ', wherein,
   θ'=52°.

6. The display panel of claim 4, wherein,
   the light extraction units comprise a first light extraction unit and a second light extraction unit, a difference between the refractive index of the first sub-unit of the first light extraction unit and the refractive index of the second sub-unit of the first light extraction unit is Δn1, a difference between the refractive index of the first sub-unit of the second light extraction unit and the refractive index of the second sub-unit of the second light extraction unit is Δn2;
   the light extraction angle of the first sub-unit in the first light extraction unit is a first light extraction angle θ1, and the light extraction angle of the first sub-unit in the second light extraction unit is a second light extraction angle θ2;
   wherein, (Δn1−Δn2)·(θ1−θ2)<0.

7. The display panel of claim 6, wherein,
   the refractive index of the first sub-unit of the first light extraction unit is n11, the refractive index of the second sub-unit of the first light extraction unit is n12, the refractive index of the first sub-unit of the second light extraction unit is n21, and the refractive index of the second sub-unit of the second light extraction unit is n22;
   wherein n22=n12, the second sub-unit of the first light extraction unit and the second sub-unit of the second light extraction unit are in the same layer and are of the same material.

8. The display panel of claim 7, wherein,
   (n11−n21)·(θ1−θ2)<0.

9. The display panel of claim 6, wherein,
   the refractive index of the first sub-unit of the first light extraction unit is n11, the refractive index of the second sub-unit of the first light extraction unit is n12, the refractive index of the first sub-unit of the second light extraction unit is n21, and the refractive index of the second sub-unit of the second light extraction unit is n22;
   wherein n11=n21, the first sub-unit of the first light extraction unit and the first sub-unit of the second light extraction unit are in the same layer and are of the same material.

10. The display panel of claim 9, wherein,
    (n21−n22)· (θ1−θ2)>0.

11. The display panel of claim 6, wherein,
    |Δn2−Δn1|=0.7 and |θ1−θ2|=5°.

12. The display panel of claim 1, wherein,
    the light extraction units comprise a first light extraction unit and a second light extraction unit, the light extraction angle of the first sub-unit in the first light extraction unit is a first light extraction angle θ1, and the light extraction angle of the first sub-unit in the second light extraction unit is a second light extraction angle θ2, θ1>θ2;
    in a direction perpendicular to the substrate, a shortest distance from an edge of the first sub-unit to an edge of a pixel opening corresponding to the first sub-unit is an opening distance, the opening distance corresponding to the first sub-unit of the first light extraction unit is a first opening distance d1, and the opening distance corresponding to the first sub-unit of the second light extraction unit is a second opening distance d2, wherein |d1|>|d2|.

13. The display panel of claim 12, wherein,
    d1>d2>0 or d1<d2≤0;
    the opening distance being a positive value indicates that the pixel opening does not overlap with the first sub-unit in the direction perpendicular to the substrate, the opening distance being a negative value indicates that the pixel opening overlaps with the first sub-unit in the direction perpendicular to the substrate, and the opening distance being equal to zero indicates that the first sub-unit is adjacent to the pixel opening in the direction perpendicular to the substrate.

14. The display panel of claim 12, wherein, d1>−d2>0 or −d1>d2>0;

the opening distance being a positive value indicates that the pixel opening does not overlap with the first sub-unit in the direction perpendicular to the substrate, the opening distance being a negative value indicates that the pixel opening overlaps with the first sub-unit in the direction perpendicular to the substrate, and the opening distance being equal to zero indicates that the first sub-unit is adjacent to the pixel opening in the direction perpendicular to the substrate.

15. The display panel of claim 4, wherein, the light-emitting units comprise a first color light-emitting unit and a second color light-emitting unit, a light-emitting efficiency of the first color light-emitting unit is lower than a light-emitting efficiency of the second color light-emitting unit, a light extraction unit corresponding to the first color light-emitting unit is a first sub-light extraction unit, a light extraction unit corresponding to the second color light-emitting unit is a second sub-light extraction unit, and the first sub-light extraction unit is different from the second sub-light extraction unit.

16. The display panel of claim 15, wherein, a difference between the refractive index of the first sub-unit of the first sub-light extraction unit and the refractive index of the second sub-unit of the first sub-light extraction unit is Δn01, and a difference between the refractive index of the first sub-unit of the second sub-light extraction unit and the refractive index of the second sub-unit of the second sub-light extraction unit is Δn02;

the light extraction angle of the first sub-unit in the first sub-light extraction unit is a first sub-light extraction angle θ01, and the light extraction angle of the first sub-unit in the second sub-light extraction unit is a second sub-light extraction angle θ02, wherein, Δn01=Δn02 and |θ01−52°|<|θ02−52°|.

17. The display panel of claim 15, wherein, a difference between the refractive index of the first sub-unit of the first sub-light extraction unit and the refractive index of the second sub-unit of the first sub-light extraction unit is Δn01, and a difference between the refractive index of the first sub-unit of the second sub-light extraction unit and the refractive index of the second sub-unit of the second sub-light extraction unit is Δn02;

the light extraction angle of the first sub-unit in the first sub-light extraction unit is a first sub-light extraction angle θ01, and the light extraction angle of the first sub-unit in the second sub-light extraction unit is a second sub-light extraction angle θ02, wherein, 45°≤θ01=θ02≤55° and |Δn01−0.21|≤|Δn02−0.21|.

18. The display panel of claim 1, wherein, in a direction perpendicular to the substrate, a thickness of the first sub-unit of the light extraction unit is a light extraction thickness;

the display panel comprises a first display area and a second display area, a light transmittance of the first display area is greater than a light transmittance of the second display area, the light extraction units comprise a third light extraction unit and a fourth light extraction unit, the third light extraction unit is arranged corresponding to a light-emitting unit of the first display area, and the fourth light extraction unit is arranged corresponding to a light-emitting unit of the second display area;

the light extraction thickness of the third light extraction unit is a first light extraction thickness h1, and the light extraction thickness of the fourth light extraction unit is a second light extraction thickness h2, wherein h1 is greater than h2.

19. The display panel of claim 18, wherein, the display panel further comprises a color filter film, wherein the color filter film comprises black matrixes, matrix openings and color resistance units, one of the matrix openings corresponds to at least one of the light-emitting units, the color resistance units are located in the matrix openings, a color of each of the color resistance units is the same as a color of a corresponding light-emitting unit;

a color resistance unit of the first display area is a first color resistance unit, a color resistance unit of the second display area is a second color resistance unit, wherein, in the direction perpendicular to the substrate, a maximum thickness of the first color resistance unit is H1, and a maximum thickness of the second color resistance unit having the same color as the first color resistance unit is H2, wherein H1<H2, wherein, the color resistance units are multiplexed into the second sub-units of the light extraction units, and in the direction perpendicular to the substrate, the first sub-units and the color resistance units have an overlapping area, and in the overlapping area, a thickness of the first color resistance unit is M1, a thickness of the second color resistance unit is M2, M1+h1=M2+h2.

20. A display device, comprising:

a display panel, comprising:
 a substrate;
 a pixel definition layer and light-emitting units, wherein the pixel definition layer is located on one side of the substrate, the pixel definition layer comprises a plurality of pixel openings, and the pixel openings are arranged corresponding to the light-emitting units;
 a light modulation structure comprising a light extraction layer and a cover layer, wherein the light extraction layer is located on a side of the cover layer close to the pixel definition layer, the light modulation structure comprises a plurality of light extraction units, each of the light extraction units comprises a first sub-unit and a second sub-unit, wherein the light extraction layer comprises a light extraction opening and the first sub-unit, first sub-units enclose the light extraction opening, the light extraction opening overlaps with the pixel openings, the second sub-unit is located in the cover layer, and a refractive index of the first sub-unit is smaller than a refractive index of the second sub-unit.

\* \* \* \* \*